(12) United States Patent
Kohn et al.

(10) Patent No.: US 10,251,310 B2
(45) Date of Patent: Apr. 2, 2019

(54) ELECTRONIC APPARATUS WITH THERMALLY-CONDUCTIVE STAND

(71) Applicant: SAGEMCOM BROADBAND SAS, Rueil Malmaison (FR)

(72) Inventors: Stephane Kohn, Rueil Malmaison (FR); Christophe Hervot, Rueil Malmaison (FR); Radu Nedelcu, Rueil Malmaison (FR)

(73) Assignee: Sagemcom Broadband SAS, Rueil Malmaison (FR)

( * ) Notice: Subject to any disclaimer, the term of this patent is extended or adjusted under 35 U.S.C. 154(b) by 0 days.

(21) Appl. No.: 15/564,137

(22) PCT Filed: Apr. 13, 2016

(86) PCT No.: PCT/EP2016/058080
§ 371 (c)(1),
(2) Date: Oct. 3, 2017

(87) PCT Pub. No.: WO2016/166137
PCT Pub. Date: Oct. 20, 2016

(65) Prior Publication Data
US 2018/0084675 A1    Mar. 22, 2018

(30) Foreign Application Priority Data

Apr. 17, 2015   (FR) ..................... 15 53462

(51) Int. Cl.
*H05K 7/20* (2006.01)
*H05K 5/02* (2006.01)
*H04N 19/44* (2014.01)

(52) U.S. Cl.
CPC ....... *H05K 7/20418* (2013.01); *H05K 5/0234* (2013.01); *H05K 7/20127* (2013.01); *H04N 19/44* (2014.11)

(58) Field of Classification Search
CPC ......... H05K 7/20127; H05K 7/2039–7/20518; G06F 1/20; G06F 1/203
USPC .............. 361/679.46–679.54, 688–723
See application file for complete search history.

(56) References Cited

U.S. PATENT DOCUMENTS

| | | | | |
|---|---|---|---|---|
| 6,108,194 A | * | 8/2000 | Seligman | H05K 5/04 174/17 R |
| 9,038,978 B1 | * | 5/2015 | Campi | H04B 1/3888 248/346.01 |
| 9,198,328 B1 | * | 11/2015 | Kokas | H05K 7/20518 |
| 2006/0262497 A1 | | 11/2006 | Jahlokov | |

(Continued)

FOREIGN PATENT DOCUMENTS

JP    2006227513 A    8/2006

*Primary Examiner* — Zachary Pape
(74) *Attorney, Agent, or Firm* — Muncy, Geissler, Olds & Lowe, P.C.

(57) ABSTRACT

The invention relates to electronic equipment including the following steps: a box including a thermally-conductive chassis; a thermally-conductive stand in contact with the chassis and including a plastics covering that covers it at least in part; and electronic components inside the box including a hottest electronic component that is the greatest source of heat inside the box and/or that presents the highest temperature from among the electronic components, the hottest electronic component being arranged in contact with the thermally-conductive chassis.

7 Claims, 2 Drawing Sheets

(56) References Cited

U.S. PATENT DOCUMENTS

| | | |
|---|---|---|
| 2006/0291161 A1 | 12/2006 | Tran et al. |
| 2010/0006259 A1 | 1/2010 | Mori et al. |
| 2013/0062495 A1* | 3/2013 | Lin .................. A47C 7/004 248/440.1 |
| 2013/0094147 A1 | 4/2013 | Shin |
| 2015/0049438 A1 | 2/2015 | Derovanessian et al. |

* cited by examiner

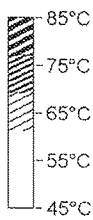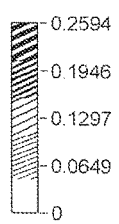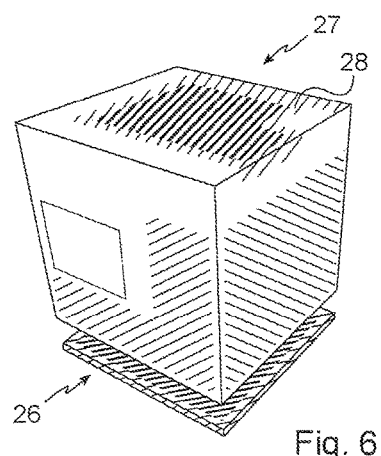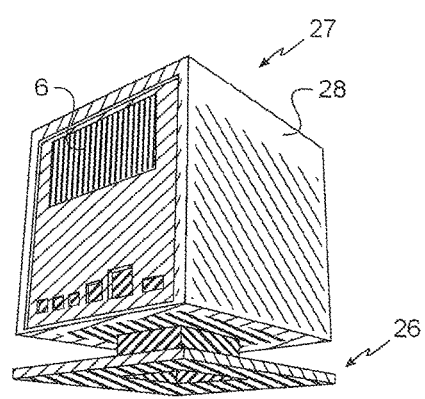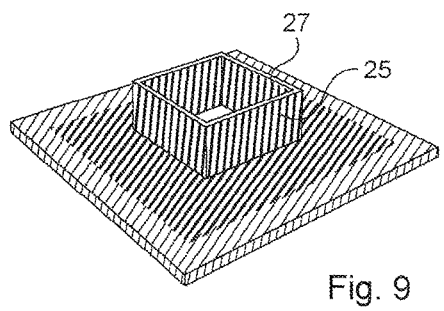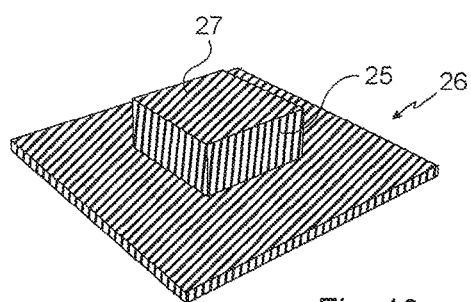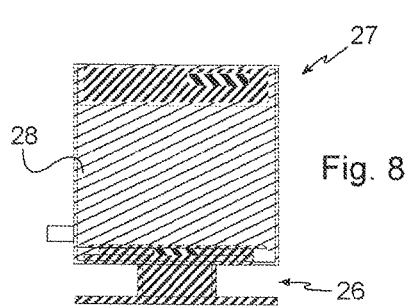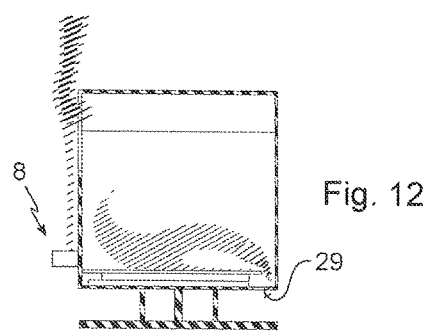

ELECTRONIC APPARATUS WITH THERMALLY-CONDUCTIVE STAND

The invention relates to dissipating heat from electronic equipment. The invention relates more particularly to electronic equipment comprising a box including a thermally-conductive chassis and a thermally-conductive stand in contact with the thermally-conductive chassis. The thermally-conductive stand is for improving the discharge of heat from the inside of the electronic equipment.

BACKGROUND OF THE INVENTION

Dissipation of the heat that results from electronic components operating inside the box of a piece of electronic equipment (television decoder etc.), leads to the temperature that exists inside the box increasing, and thus to increasing the temperature of the box itself.

The increase in the temperature of the box is problematic since the box must not present a temperature that might inconvenience or injure a user as a result of making contact with the box. Concerning those outside portions of a box of a piece of electronic equipment of the decoder type that are not intended to be held or touched by the user on a continuous basis, the maximum acceptable temperature is conventionally 95° C. when said portions are made of plastics material, and 70° C. when said portions are made of metal.

In addition, the increase in the temperature that exists inside the box is problematic because of the impact it has on the electronic components inside the box.

Most electronic components are sensitive to temperature: a high temperature can have consequences on the performance of components, on the failure rate of components, on the integrity of component packages, etc.

The maximum admissible temperature inside a box of electronic equipment of the decoder type is conventionally 90° C.

A first solution is available to the designers of electronic cards that encounter such a temperature problem. This first solution consists in using specific components that are capable of operating for longer at higher temperatures. The use of such specific components is often very expensive since it requires either designing components that are dedicated to the application in question, or else selecting components after performing additional tests concerning thermal qualification. Furthermore, this first solution does not solve the problem of increasing the temperature of the box itself.

A second solution, which is less expensive, and which makes it possible to reduce both the temperature of the box and also the temperature inside the box, consists in improving the discharge of heat from the inside of the box, generally by having recourse to forced ventilation in channels arranged inside the box of the equipment. Such forced ventilation nevertheless presents numerous drawbacks, including increasing the overall size of the equipment, increasing its electricity consumption, increasing the noise it produces when in operation, and possibly leading to the introduction of dust that might degrade the performance of the ventilation. It should also be observed that the short lifetime of fans or blowers in a hot environment can lead to premature failure of the equipment.

OBJECT OF THE INVENTION

An object of the invention is to improve the discharge of heat from the inside of an electronic equipment box.

SUMMARY OF THE INVENTION

In order to achieve this object, there is provided electronic equipment comprising:
a box including a thermally-conductive chassis;
a thermally-conductive stand in contact with the thermally-conductive chassis; and
electronic components incorporated inside the box and including an electronic component placed in contact with the thermally-conductive chassis.

The term "arranged in contact" is used to mean that the electronic component is arranged relative to the chassis in such a manner that heat transfer can be established by conduction between the electronic component and the chassis. The electronic component is thus directly in contact with the chassis or else it is in contact with the chassis via an additional part (optionally fastened to the chassis) acting as a heat guide.

The thermally-conductive stand, in contact with the chassis, which is itself in contact with an electronic component, serves to improve the discharge of the heat dissipated by that electronic component. This improvement in the discharge of heat results from the box being raised by the stand and from the increase in the thermally-conductive surface area as a result of the surface area of the stand, which is itself thermally conductive.

BRIEF DESCRIPTION OF THE DRAWINGS

Reference is made to the accompanying drawings, in which:

FIG. 5 is a temperature scale for interpreting FIGS. 6 to 10;

FIGS. 6 to 8 show the temperatures measured at various locations in a third embodiment of electronic equipment of the invention;

FIGS. 9 and 10 show the temperatures measured at various locations of a thermally-conductive stand in third embodiment of electronic equipment of the invention;

FIG. 11 is a speed scale for interpreting FIG. 12; and

FIG. 12 shows the speeds measured at various locations in the equipment of the hot air that is discharged from the inside of the electronic equipment.

DETAILED DESCRIPTION OF THE INVENTION

The description begins with the structure of the electronic equipment of the invention.

Figure 1:
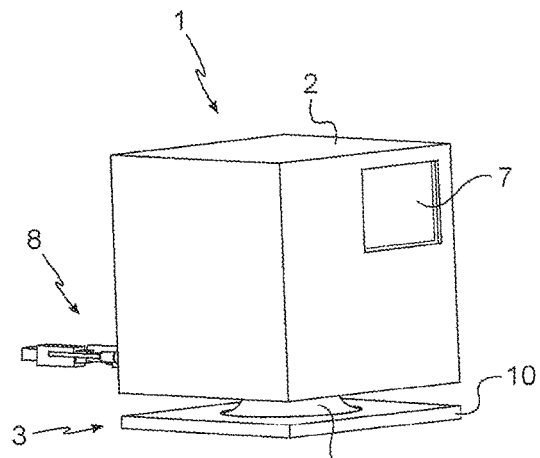
FIGS. 1 and 2 are respective views of a first embodiment of electronic equipment of the invention.
Figure 2:
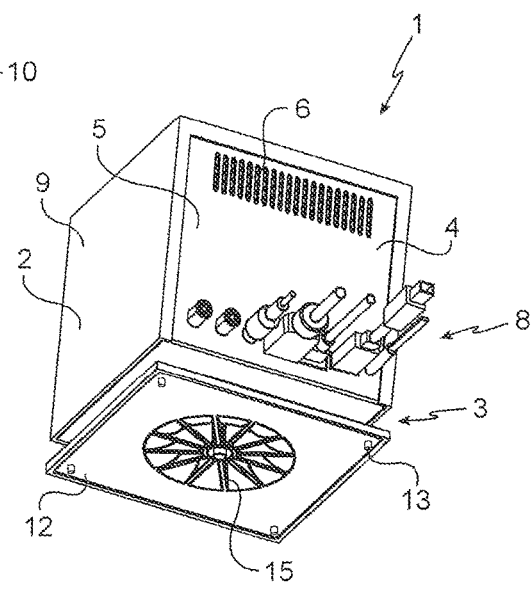
Figure 3:
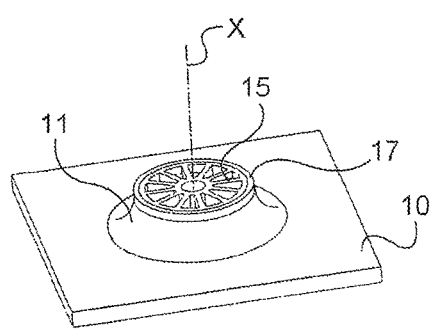
FIG. 3 is a perspective view from above of a thermally-conductive stand of the electronic equipment of the invention in the first embodiment.

With reference to FIGS. 1 to 3, the electronic equipment of the invention in a first embodiment is constituted in this example by a decoder 1 for decrypting and playing back television signals.

The decoder 1 comprises a box 2, a thermally-conductive stand 3 supporting the box 2, and electronic components mounted on one or more electronic cards arranged in the box 2.

The box 2 is generally in the shape of a cube. The box 2 has a main outside portion 9 made of plastics material and a thermally-conductive chassis 4, made of metal in this example, that is arranged inside the main portion 9. The thermally-conductive chassis 4 is made of aluminum. The chassis 4 includes in particular a rear face 5 of the box 2 that is provided with discharge vents 6 for discharging heat from the inside of the box 2. A display screen 7 and various connectors 8 connected to at least one of the electronic cards are visible at the outside of the box 2. These connectors 8 include an electrical connector for supplying power to the decoder 1 together with connectors for exchanging various signals with other pieces of electronic equipment (Ethernet, HDMI, etc. . . . connectors).

The thermally-conductive stand 3 is a casting, made of aluminum in this example, that comprises a base 10 and a leg 11.

The leg 11 extends vertically between the base 10 and the metal chassis 4. The leg 11 is defined by a tubular wall forming a body of revolution about a vertical axis X and connecting with the base 10 via a fillet.

The base 10 is generally in the form of a flat square. The base 10 is for placing on a piece of furniture or any other support for carrying the decoder 1. A bottom face 12 of the base 10 is provided with plastics studs 13 to avoid damaging the furniture.

By way of example, the sides of the base 10 of the thermally-conductive stand 3 have a length of 130 millimeters (mm), the base 10 has a thickness of 7 mm, and the height of the leg 11 is 20 mm, with the tubular wall forming the leg 11 having a thickness of 2.5 mm.

Fins 15 extend inside the leg 11 in planes that are radial relative to the axis X of the leg 11.

The base 10 and the leg 11 of the thermally-conductive stand 3 are completely covered in a covering 17 of thermoplastic material.

By way of example, the thickness of the plastics covering 17 is 2.5 mm.

The electronic components incorporated in the box 2 include in particular power supply components for powering the electronic components of the decoder 1, processing components for performing the decryption functions of the decoder 1, communication components for establishing communication between the decoder 1 and the other pieces of electronic embodiment, etc.

Among these electronic components, a particular electronic component, referred to herein as the "hottest" electronic component, constitutes a main source of heat and is arranged in contact with the chassis 4 of the box 2 of the decoder 1. The hottest electronic component is the component that, in operation, constitutes the greatest source of heat from among the electronic components of the decoder 1. In this example, this component is also the component that, in operation, has the package that presents the highest temperature. Where necessary, a thermally-conductive paste is interposed between the chassis 4 and the component in order to increase heat transfer from the hottest electronic component to the chassis 4.

It should be observed that the thermally-conductive stand 3 may perfectly well be of some other shape and/or some other structure.

Figure 4:
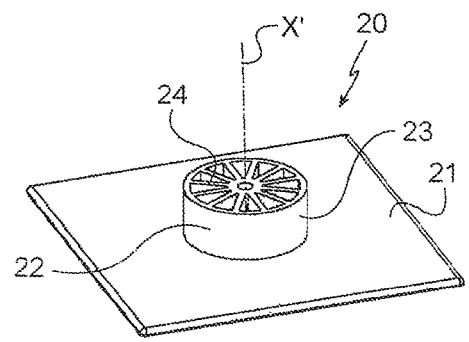
FIG. 4 is a perspective view from above of a thermally-conductive stand of the electronic equipment of the invention in a second embodiment.

Thus, with reference to FIG. 4, a thermally-conductive stand 20 of electronic equipment in a second embodiment of the invention (specifically another decoder) comprises a base 21 and a leg 22 that form two distinct parts.

The base 21 is constituted by a cutout square metal plate. The leg 22 is a section member comprising a tubular portion 23 and fins 24 extending inside the tubular portion 23 in planes that are radial relative to an axis X' of the tubular portion 23.

The base 21 and the leg 22 are fastened together by conventional fastener means (screw fastening, soldering, adhesive, crimping, etc.).

In a third embodiment, shown in FIGS. 6 to 10 and 12, the leg 25 of the thermally-conductive stand 26 of the electronic equipment or decoder 27 in a third embodiment of the invention is a prism of square section. Under such circumstances, the above-mentioned means for fastening the thermally-conductive stand 26 to the chassis are preferably associated with one or more abutments against rotation for ensuring that the faces of the leg 25 remain parallel to the faces of the box 2 of the decoder 27.

The advantages of the invention are described below.

The invention serves to improve the discharge of heat from the inside of the box 2 of the decoder 1, 27, which heat is due to the power dissipated by the electronic components in operation, and in particular by the hottest electronic component. The consequence of this heat is to increase the temperature that exists inside the box 2.

The improvement with which heat is discharged is due firstly to the box 2 being raised by the thermally-conductive stand 3, 20, 26, thereby serving to form an air passage and to increase the stream of hot air that is discharged. The natural convection speed of the hot air that is discharged is doubled.

The improvement with which heat is discharged is also due to increasing the thermally-conductive area constituted by the surface area of the leg and of the base of the thermally-conductive stand 3, 20, 26.

The thermally-conductive stand thus enables the "hot" surface area of the electronic equipment to be increased, thereby improving the discharge of heat by radiation.

Finally, the discharge of heat is also improved as a result of the increase in the surface area for thermal convection due to the fins 15, 24.

Together these phenomena enable the temperature of each element in the decoder 1, 27 to be reduced on average by 10° C.

With reference to FIGS. 5 to 9, and for electronic equipment 27 in the third embodiment, the temperature of the box 2 lies in the range 65.7° C. to 71.9° C. depending on location, and the temperature of the stand lies in the range 66° C. to 73.6° C. Only the zone located in the top portion of the inside of the box 2 of the electronic equipment 27 presents a temperature that is slightly greater than 75° C. The above-mentioned maximum temperatures are thus not reached.

With reference to FIGS. 10 and 11, and as a result of the box being raised by the stand, the discharged hot air flows at a relatively fast speed through the slots 6 and through an orifice 29 formed in a bottom face of the box 2.

Naturally, the invention is not limited to the embodiments described but covers any variant coming within the ambit of the invention as defined by the claims.

Although it is stated that the stand is made of aluminum, it could equally well be made out of some other material: steel, brass, copper, zamac, etc.

Although the stands described above all have a leg that is hollow, the stand of the electronic equipment of the invention could equally well be solid.

Although it is stated that the base and the leg of the thermally-conductive stand are completely covered in a plastics covering, it is sufficient for them to be covered in such a covering at least in part.

Although the hottest electronic component as described above is both the component that in operation constitutes the major source of heat from among the electronic components of the decoder and also the component that in operation presents a package having the highest temperature, it is possible for these two characteristics to be presented by two different components. Under such circumstances, the hottest electronic component in contact with the chassis is one of those two components (under such circumstances, both of those components could naturally be positioned in contact with the chassis).

The above-mentioned fastener means may be replaced by any suitable type of fastener means. In order to fasten the stand to the chassis, it is possible for example to make use of a rotary bayonet type fastening with an abutment and final locking so as to enable the stand to be installed and removed quickly.

The invention claimed is:

1. An electronic equipment comprising:
   a box including a thermally-conductive chassis;
   a thermally-conductive stand in contact with the thermally-conductive chassis; and
   electronic components incorporated inside the box and including an electronic component placed in contact with the thermally-conductive chassis,
   wherein the thermally-conductive stand comprises a base and a leg that extends vertically between the base and the thermally-conductive chassis, and
   wherein fins are formed inside the leg.

2. The electronic equipment according to claim 1, wherein the electronic component placed in contact with the thermally-conductive chassis is a hottest electronic component that is the greatest source of heat inside the box and/or that, in operation, presents the highest temperature from among the electronic components of the electronic equipment.

3. The electronic equipment according to claim 1, wherein the base and the leg are constituted by two distinct parts that are fastened together.

4. The electronic equipment according to claim 1, wherein the leg of the thermally-conductive stand comprises a section member.

5. The electronic equipment according to claim 1, wherein the fins lie in planes that are radial relative to an axis of the leg.

6. The electronic equipment according to claim 1, wherein the thermally-conductive stand includes a plastics covering that covers it, at least in part.

7. The electronic equipment according to claim 1, the electronic equipment being a decoder for a television.

* * * * *